United States Patent
Wang

(10) Patent No.: US 12,189,243 B2
(45) Date of Patent: Jan. 7, 2025

(54) DISPLAY APPARATUS

(71) Applicants: BEIJING BOE DISPLAY TECHNOLOGY CO., LTD., Beijing (CN); BOE TECHNOLOGY GROUP CO., LTD., Beijing (CN)

(72) Inventor: Mengjie Wang, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 316 days.

(21) Appl. No.: 17/765,429

(22) PCT Filed: Apr. 13, 2021

(86) PCT No.: PCT/CN2021/086799
§ 371 (c)(1),
(2) Date: Mar. 30, 2022

(87) PCT Pub. No.: WO2021/238467
PCT Pub. Date: Dec. 2, 2021

(65) Prior Publication Data
US 2022/0365384 A1   Nov. 17, 2022

(30) Foreign Application Priority Data
May 29, 2020   (CN) .......................... 202020950733.2

(51) Int. Cl.
*G02F 1/1339*   (2006.01)
*G02F 1/1343*   (2006.01)
(Continued)

(52) U.S. Cl.
CPC ...... *G02F 1/13396* (2021.01); *G02F 1/13394* (2013.01); *G02F 1/134345* (2021.01);
(Continued)

(58) Field of Classification Search
CPC ........... G02F 1/13396; G02F 1/134345; G02F 1/13394; G02F 1/136286; G02F 1/1368; G02F 1/13439
(Continued)

(56) References Cited

U.S. PATENT DOCUMENTS 10,481,454 B1 * 11/2019 Xiong ............... G02F 1/134363
2004/0233343 A1 * 11/2004 Baek ................. G02F 1/134336
349/38

(Continued)

FOREIGN PATENT DOCUMENTS

| CN | 103487994 A | 1/2014 |
|---|---|---|
| CN | 104849920 A | 8/2015 |

(Continued)

*Primary Examiner* — Dung T Nguyen
*Assistant Examiner* — David Y Chung
(74) *Attorney, Agent, or Firm* — IP & T GROUP LLP

(57) ABSTRACT

A display apparatus includes an array substrate and an opposite substrate arranged opposite the array substrate. The array substrate includes a first substrate and a plurality of sub-pixels disposed on the first substrate and arranged in an array. The opposite substrate includes a second substrate and a plurality of first spacers arranged at a side of the second substrate proximate to the array substrate. An orthographic projection, on the array substrate, of a first spacer is in a region where a region between two adjacent rows of sub-pixels intersects with a region between two adjacent columns of sub-pixels.

14 Claims, 8 Drawing Sheets

(51) Int. Cl.
    *G02F 1/1362*    (2006.01)
    *G02F 1/1368*    (2006.01)
    *H01L 27/12*     (2006.01)
(52) U.S. Cl.
    CPC ...... *G02F 1/136286* (2013.01); *G02F 1/1368* (2013.01); *H01L 27/124* (2013.01); *G02F 1/13439* (2013.01)
(58) Field of Classification Search
    USPC .................. 349/38, 39, 46, 106, 110, 156
    See application file for complete search history.

(56) References Cited

U.S. PATENT DOCUMENTS

| | | | |
|---|---|---|---|
| 2013/0342782 A1* | 12/2013 | Kim | G02F 1/13394 |
| | | | 349/46 |
| 2014/0347586 A1 | 11/2014 | Wang et al. | |
| 2016/0327824 A1 | 11/2016 | Chen et al. | |
| 2017/0192281 A1 | 7/2017 | Kwon | |
| 2018/0180934 A1* | 6/2018 | Hu | G02F 1/133514 |
| 2019/0243197 A1 | 8/2019 | Itoo | |
| 2019/0339555 A1 | 11/2019 | Yoshida | |

FOREIGN PATENT DOCUMENTS

| | | |
|---|---|---|
| CN | 205427389 U | 8/2016 |
| CN | 110119055 A | 8/2019 |
| CN | 110121675 A | 8/2019 |
| CN | 211928360 U | 11/2020 |
| WO | 2012/124699 A1 | 9/2012 |

* cited by examiner

DISPLAY APPARATUS

CROSS-REFERENCE TO RELATED APPLICATIONS

The present disclosure is a national phase entry under 35 USC 371 of International Patent Application No. PCT/CN2021/086799 filed on Apr. 13, 2021, which claims priority to Chinese Patent Application No. 202020950733.2, filed on May 29, 2020, which are incorporated herein by reference in their entirety.

TECHNICAL FIELD

The present disclosure relates to the field of display technologies, and in particular, to a display apparatus.

BACKGROUND

In recent years, with the progress of display technologies, users' requirements on perception experience are becoming higher and higher. Liquid crystal display technology has been successfully applied to display products, such as notebook computers, display screens or televisions. With the increase in the number of liquid crystal display products owned by people, people have higher requirements on the display quality of liquid crystal products.

SUMMARY

A display apparatus is provided. The display apparatus includes an array substrate and an opposite substrate arranged opposite to the array substrate. The array substrate includes a first substrate and a plurality of sub-pixels disposed on the first substrate and arranged in an array. The opposite substrate includes a second substrate and a plurality of first spacers disposed on a side of the second substrate proximate to the array substrate. An orthographic projection of a first spacer on the array substrate is located in a region where a region between two adjacent rows of sub-pixels intersects with a region between two adjacent columns of sub-pixels.

In some embodiments, the opposite substrate further includes a plurality of second spacers. An orthographic projection of a second spacer on the second substrate is non-overlapping with an orthographic projection of the first spacer on the second substrate. The plurality of second spacers are arranged in a plurality of columns, and second spacers in each column are arranged in a column direction in which the plurality of sub-pixels are arranged. Orthographic projections of the second spacers in each column on the array substrate are located in a column region where a column of sub-pixels are located.

In some embodiments, the plurality of second spacers and the plurality of first spacers are disposed in a same layer.

In some embodiments, a dimension of the first spacer and a dimension of the second spacer are approximately equal in a direction perpendicular to a plane where the second substrate is located.

In some embodiments, in a unit area of 1 mm$^2$ of the array substrate, a sum of an area of a surface of the first spacer away from the second substrate and an area of a surface of the second spacer away from the second substrate is greater than 10000 μm$^2$.

In some embodiments, the opposite substrate further includes a plurality of filter patterns disposed on a side of the first spacers proximate to the second substrate and second spacers. Orthographic projections of a column of sub-pixels on the first substrate are within an orthographic projection of a filter pattern on the first substrate, and an orthographic projection of the first spacer on the second substrate is located within an orthographic projection of the filter pattern on the second substrate. In a direction perpendicular to an extension direction of the filter pattern, the filter pattern has a protruding portion at a position corresponding to the first spacer. The orthographic projection of the first spacer on the second substrate overlaps with an orthographic projection of the protruding portion of the filter pattern on the second substrate. An orthographic projection of the protruding portion on the second substrate is non-overlapping with an orthographic projection of a second spacer on the second substrate.

In some embodiments, a filter pattern adjacent to the protruding portion in the plurality of filter patterns has a recessed portion. The protruding portion extends into the recessed portion.

In some embodiments, the array substrate further includes a plurality of gate lines disposed on the first substrate. At least one gate line is located between the two adjacent rows of sub-pixels. An orthographic projection of the first spacer on the first substrate overlaps with an orthographic projection of a gate line of the at least one gate line on the first substrate. The opposite substrate further includes a plurality of second spacers, an orthographic projection of a second spacer on the first substrate overlaps with the orthographic projection of the gate line of the at least one gate line on the first substrate.

In some embodiments, in a column direction in which the sub-pixels are arranged, the gate line has a protruding portion. The opposite substrate further includes a plurality of second spacers, an orthographic projection of a second spacer on the array substrate is located in a region where the protruding portion of the gate line is located.

In some embodiments, in the column direction in which the sub-pixels are arranged, the protruding portion of the gate line protrudes towards a side away from a row of sub-pixels coupled to the gate line.

In some embodiments, two gate lines are disposed between the two adjacent rows of sub-pixels. In a column direction in which the sub-pixels are arranged, in two adjacent sub-pixels in a row of sub-pixels, a gate line to which a sub-pixel is coupled is located on a side of two opposite sides of the row of sub-pixels in the column direction, and a gate line to which another sub-pixel is coupled is located on another side of the two opposite sides of the row of sub-pixels in the column direction.

In some embodiments, the opposite substrate includes a plurality of second spacers, in the region between the two adjacent rows of sub-pixels, an orthographic projection of a second spacer in two adjacent second spacers on the first substrate overlaps with an orthographic projection of a gate line in the two gate lines on the first substrate, and an orthographic projection of another second spacer in the two adjacent second spacers on the first substrate overlaps with an orthographic projection of another gate line in the two gate lines on the first substrate.

In some embodiments, the array substrate further includes a plurality of data lines disposed on the first substrate. Two adjacent columns of sub-pixels are coupled to a data line.

In some embodiments, the array substrate further includes a plurality of common signal lines disposed on the first substrate. The plurality of common signal lines and the plurality of data lines are disposed in a same layer and have a same extension direction. A common signal line is located between two adjacent columns of sub-pixels. In a row direction in which the sub-pixels are arranged, a common signal line is located between two adjacent data lines. The orthographic projection of the first spacer on the first substrate overlaps with an orthographic projection of the common signal line on the first substrate.

In some embodiments, the array substrate further includes a thin film transistor disposed in a sub-pixel. Thin film transistors in the two adjacent sub-pixels in the row of sub-pixels are respectively located on two opposite sides of the row of sub-pixels in the column direction in which the sub-pixels are arranged. For the two opposite sides of the row of sub-pixels in the column direction, a thin film transistor of the thin film transistors in the two adjacent sub-pixels on a side is coupled to a gate line disposed on a same side as the thin film transistor on the side, and another thin film transistor of the thin film transistors in the two adjacent sub-pixels on another side is coupled to a gate line disposed on a same side as the thin film transistor on the another side.

In some embodiments, the opposite substrate includes a plurality of second spacers. An orthographic projection of a second spacer on the first substrate is non-overlapping with an orthographic projection of the thin film transistor on the first substrate.

In some embodiments, the opposite substrate further includes a plurality of second spacers, an orthographic projection of a second spacer on the first substrate overlaps with an orthographic projection of the thin film transistor on the first substrate.

In some embodiments, the array substrate further includes a plurality of first electrodes disposed on the first substrate. A first electrode is located in the sub-pixel, and the first electrode is coupled to the thin film transistor. The opposite substrate further includes a second electrode disposed on the second substrate. The second electrode is located on a side of the first spacers proximate to the second substrate.

In some embodiments, the array substrate further includes a first electrode and a second electrode disposed on the first substrate and located in the sub-pixel. The first electrode is a planar electrode, and the second electrode is a slit electrode. The first electrode is closer to the first substrate than the second electrodes. One of the first electrode and the second electrode is coupled to the thin film transistor.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, and are not limitations on actual sizes of products, actual processes of methods and actual timings of signals involved in the embodiments of the present disclosure.

DETAILED DESCRIPTION

Figure 1:
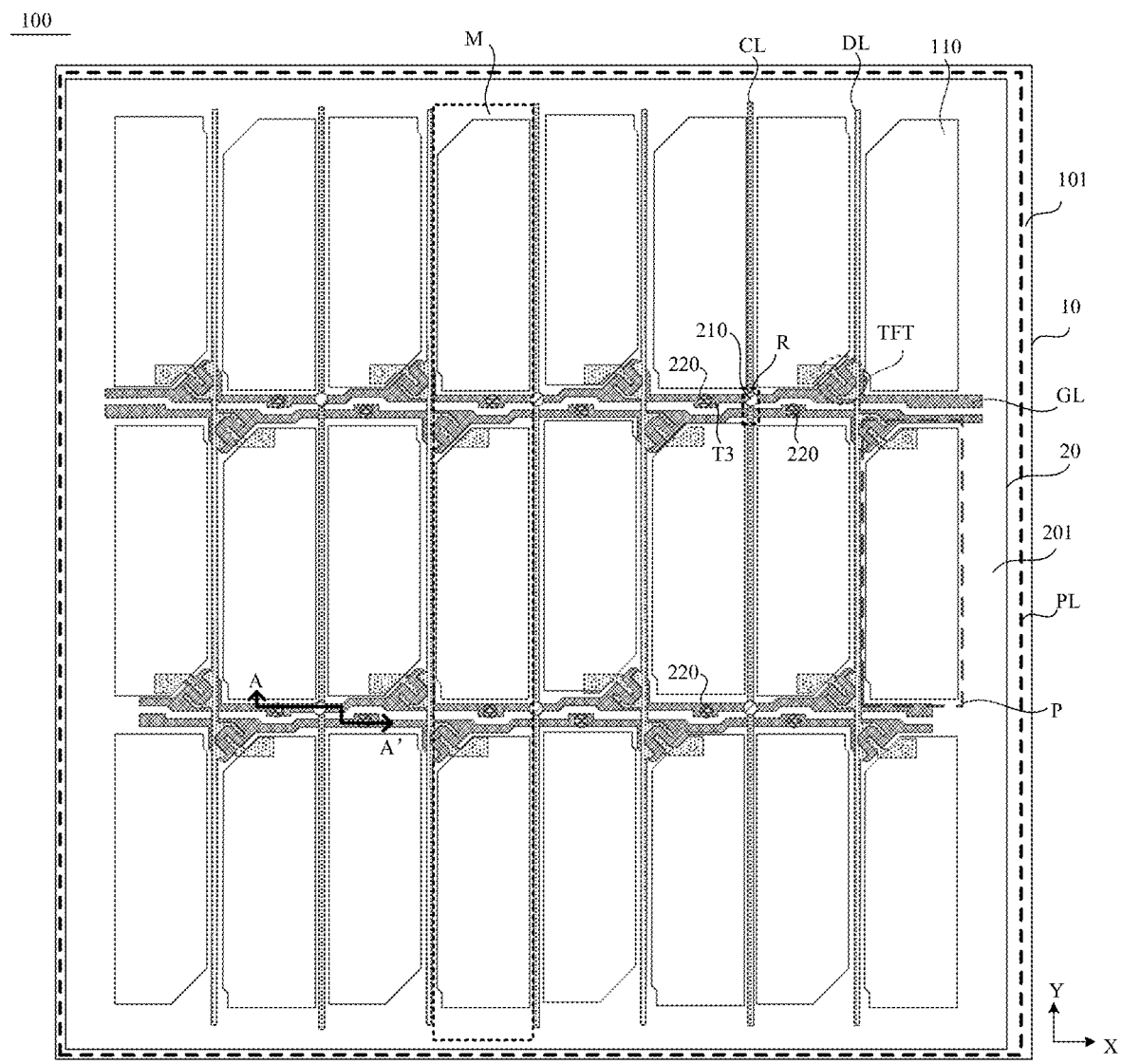
FIG. 1 is a structural diagram of a display panel, in accordance with some embodiments.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description of the specification, the terms such as "one embodiment", "some embodiments", "exemplary embodiments", "example", "specific example" and "some examples" are intended to indicate that specific features, structures or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, a feature defined with the term such as "first" or "second" may explicitly or implicitly include one or more of the features. In the description of the embodiments of the present disclosure, the term "a plurality of/the plurality of" means two or more unless otherwise specified.

In the description of some embodiments, terms such as "coupled" and "connected" and their extensions may be used. For example, the term "connected" may be used in the description of some embodiments to indicate that two or more components are in direct physical or electrical contact with each other. As another example, the term "coupled" may be used in the description of some embodiments to indicate that two or more components are in direct physical or electrical contact. The term "coupled" or "communicatively coupled", however, may also mean that two or more components are not in direct contact with each other, but still cooperate or interact with each other. The embodiments disclosed herein are not necessarily limited to the content herein.

As used herein, a term such as "about", "substantially" or "approximately" includes a stated value and an average value within an acceptable range of deviation of a particular value. The acceptable range of deviation is determined by a person of ordinary skill in the art in view of the measurement in question and the error associated with the measurement of a particular quantity (i.e., the limitations of the measurement system).

Exemplary embodiments are described herein with reference to sectional views and/or plan views as idealized exemplary drawings. In the drawings, thicknesses of layers and sizes of regions are enlarged for clarity. Thus, variations in shape relative to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a curved feature. Therefore, the regions shown in the accompanying drawings are schematic in nature, and their shapes are not intended to show actual shapes of regions in a device, and are not intended to limit the scope of the exemplary embodiments.

A pogo test is performed on a display panel, that is, fix the display panel is fixed on a platform for the pogo test, and the display panel is pressed (e.g., a pressure is 50 kgf) by a pressure head of a pogo test device, after keeping for a period of time, the pressure head is removed and the display panel is lightened to confirm a pressing phenomenon. A supporting area of spacers is insufficient due to a low resolution (i.e., a low Pixels Per Inch (PPI)) of some display panels, and thus an anti-pressure ability of the display panel is relatively weak. As a result, after the pogo test, a black spot will appear at a pressuring position of the display panel, and does not disappear for a long time or disappears slowly, so that a quality of the display panel may be affected seriously.

Figure 9:
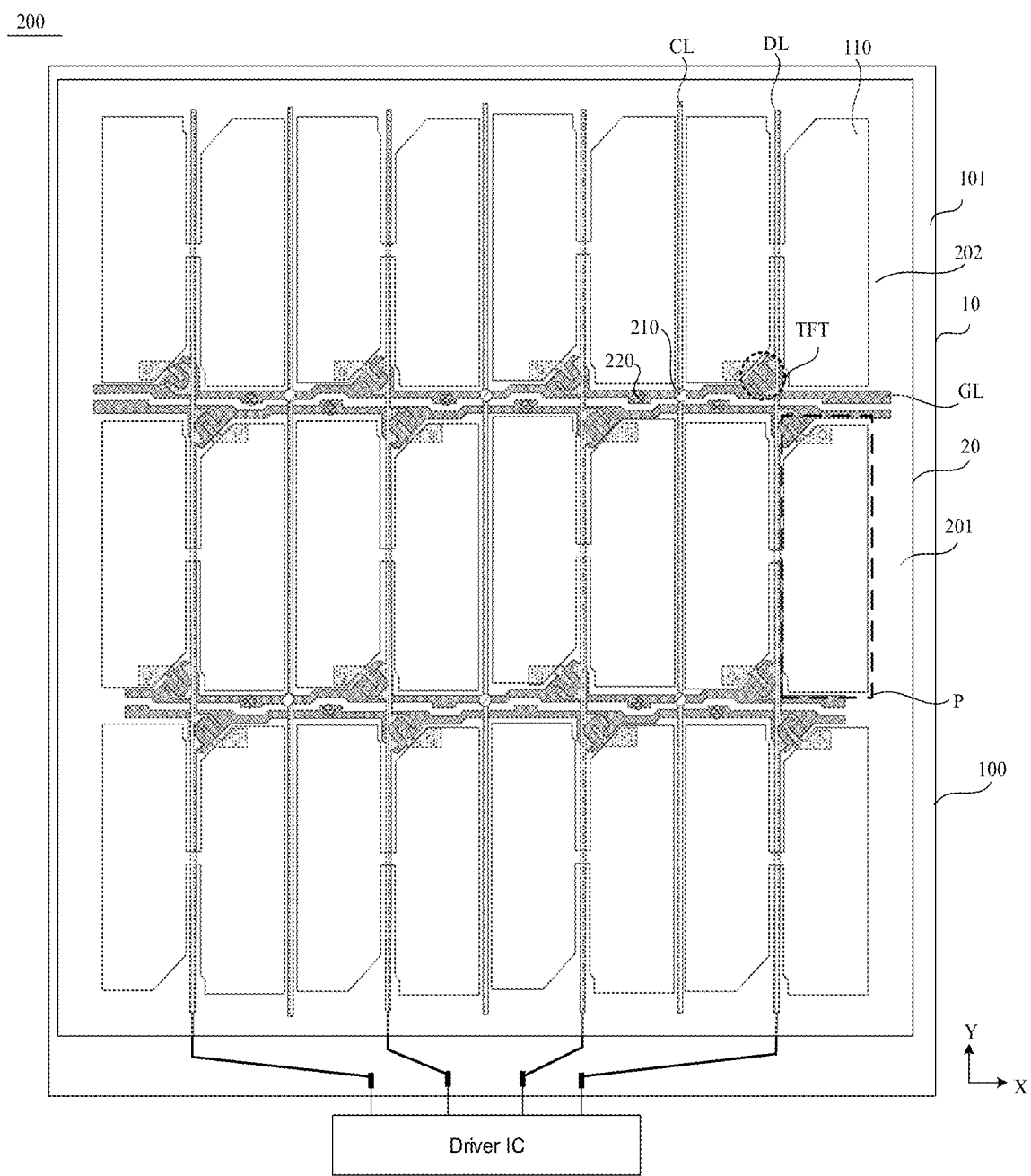
FIG. 9 is a structural diagram of a display apparatus, in accordance with some embodiments.

Embodiments of the present disclosure provide a display apparatus 200, as shown in FIG. 9, the display apparatus 200 includes a display panel 100.

Figure 2:
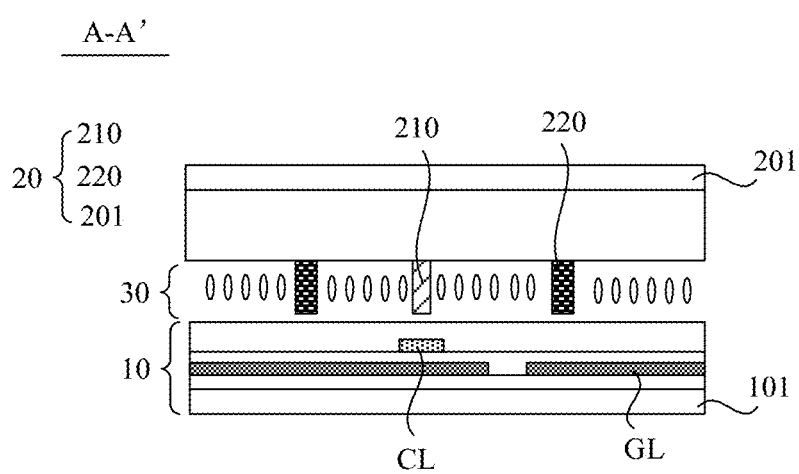
FIG. 2 is a sectional view of the display panel in FIG. 1 taken along the line A-A'.

As shown in FIGS. 1 and 2, the display panel 100 includes an array substrate 10 and an opposite substrate 20. The array substrate 10 and the opposite substrate 20 are arranged opposite to each other.

The display panel 100 further includes a liquid crystal layer 30 disposed between the array substrate 10 and the opposite substrate 20.

The array substrate 10 includes a first substrate 101 and a plurality of sub-pixels P disposed on the first substrate 101. The plurality of sub-pixels P are arranged in an array.

For example, as shown in FIG. 1, sub-pixels P arranged in a line in a horizontal direction X are referred to as a row of sub-pixels, and sub-pixels P arranged in a line in a vertical direction Y are referred to as a column of sub-pixels.

The opposite substrate 20 includes a second substrate 201 and a plurality of first spacers 210 disposed on the second substrate 201.

An orthographic projection of a first spacer 210 on the array substrate 10 is located in a region R where a region between two adjacent rows of sub-pixels intersects with a region between two adjacent columns of sub-pixels.

In this case, in a process of pressing the display panel 100, the first spacers 210 may support the display panel 100, which may improve the anti-pressure ability of the display panel 100 compared to a case where there is no spacer in the region where the region between two adjacent rows of sub-pixels intersects with the region between two adjacent columns of sub-pixels.

Therefore, in the display panel 100 in the embodiments of the present disclosure, an orthographic projection of a first spacer 210 of the plurality of first spacers 210 in the opposite substrate 20 on the array substrate 10 is located in a region where a region between two adjacent rows of sub-pixels intersects with a region between two adjacent columns of sub-pixels, the first spacer 210 may support the display panel 100 when the display panel 100 is pressed. Compared to the case where there is no spacer in the region where the region between two adjacent rows of sub-pixels intersects with the region between two adjacent columns of sub-pixels, the supporting area of the spacers in the embodiments of the present disclosure to the display panel 100 is increased, a supporting strength of the spacers to the display panel 100 is improved, and the anti-pressure ability of the display panel 100 is improved, thereby preventing the display panel 100 from being pressed poorly, and improving the anti-pressure ability of the display apparatus 200.

In some embodiments, as shown in FIGS. 1 and 2, the opposite substrate 20 further includes a plurality of second spacers 220.

Orthographic projections of the second spacers 220 on the second substrate 201 are non-overlapping with orthographic projections of the first spacers 210 on the second substrate 201.

The plurality of second spacers 220 are arranged in a plurality of columns, and second spacers in each column are arranged in a column direction (i.e., the vertical direction Y) in which the plurality of sub-pixels P are arranged. Orthographic projections of the second spacers 220 in each column on the array substrate 10 are located in a column region where a column of sub-pixels are located.

It will be noted that a column region where a column of sub-pixels are located includes a region where each sub-pixel in the column of sub-pixels is located and a region between every two adjacent sub-pixels in the column of sub-pixels, and reference can be made to the M region in FIG. 1.

For example, an orthographic projection of the second spacer 220 on the first substrate 101 is located between orthographic projections of two adjacent sub-pixels in the same column on the first substrate 101.

In this case, when the display panel 100 is pressed, the first spacers 210 and the second spacers 220 may support the display panel 100 together, and thus a supporting area of the first spacers 210 and the second spacers 220 to the display panel 100 is increased, the supporting strength of the first spacers 210 and the second spacers 220 to the display panel 100 is improved, and the anti-pressure ability of the display panel 100 is improved, thereby preventing the display panel 100 from being pressed poorly.

The first spacers 210 and the second spacers 220 are all auxiliary spacers. For example, a distribution density of the auxiliary spacers (including the first spacers 210 and the second spacers 220) in the embodiments of the present disclosure is increased by 50% compared to a distribution density of original auxiliary spacers (only including the second spacers, and not including the first spacers). In a case where a supporting area of the first spacers 210 and a supporting area of the second spacers 220 are equal, a supporting area of the auxiliary spacers (including the first spacers 210 and the second spacers 220) is increased by 50% compared to a supporting area of the original auxiliary spacers (only including the second spacers, and not including the first spacers).

It will be noted that, in a direction parallel to a plane where the second substrate 201 is located, a distance between edges proximate to each other of the first spacer 210 and the second spacer 220 adjacent to the first spacer 210 is greater than a deviation of process capability in an actual production process. In this way, it is possible to avoid affecting film-forming effects of the first spacers 210 and the second spacers 220 due to actual process errors, thereby avoiding affecting supporting capacities of the first spacers 210 and the second spacers 220, and avoiding affecting the anti-pressure ability of the display panel 100.

In some embodiments, the plurality of second spacers 220 and the plurality of first spacers 210 are disposed in the same layer.

A material of the plurality of second spacers 220 is the same as a material of the plurality of first spacers 210.

In this case, the second spacers 220 and the first spacers 210 are formed synchronously, thereby saving processes.

In some embodiments, as shown in FIGS. 1 to 4, a dimension of the first spacer 210 and a dimension of the second spacer 220 are equal or approximately equal in a direction perpendicular to the plane PL where the second substrate 201 is located.

It will be understood that a distance between a surface of the first spacer 210 proximate to the array substrate 10 and a surface of the first spacer 210 proximate to the second substrate 201 is equal or approximately equal to a distance between a surface of the second spacer 220 proximate to the array substrate 10 and a surface of the second spacer 220 proximate to the second substrate 201.

In some embodiments, in a unit area of 1 mm² of the array substrate 10, a sum of an area of surfaces of the first spacers 210 away from the second substrate 201 and an area of surfaces of the second spacers 220 away from the second substrate 201 is greater than 10000 µm². In this way, the supporting strength of the display panel 100 may be improved, thereby avoiding the black spot or a defect of Mura of the display panel 100.

It will be noted that a shape of the orthographic projection of the first spacer 210 on the array substrate 10 and a shape of the orthographic projection of the second spacer 220 on the array substrate 10 may be the same or different, for example, both of them may be circular or hexagonal.

An area of the orthographic projection of the first spacer 210 on the array substrate 10 and an area of the orthographic projection of the second spacer 220 on the array substrate 10 may be equal or not equal.

Figure 3:
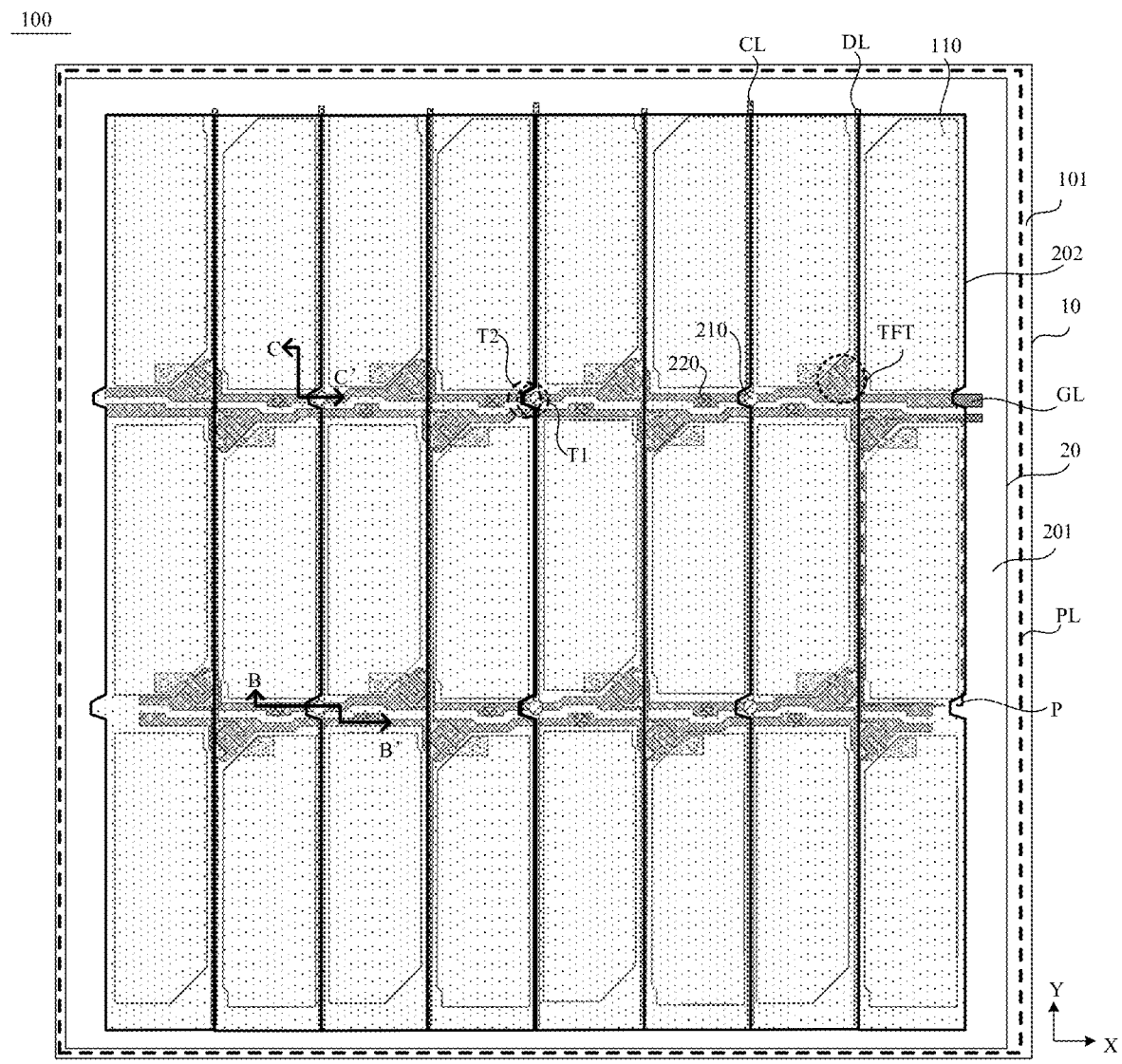
FIG. 3 is a structural diagram of another display panel, in accordance with some embodiments.
Figure 4:
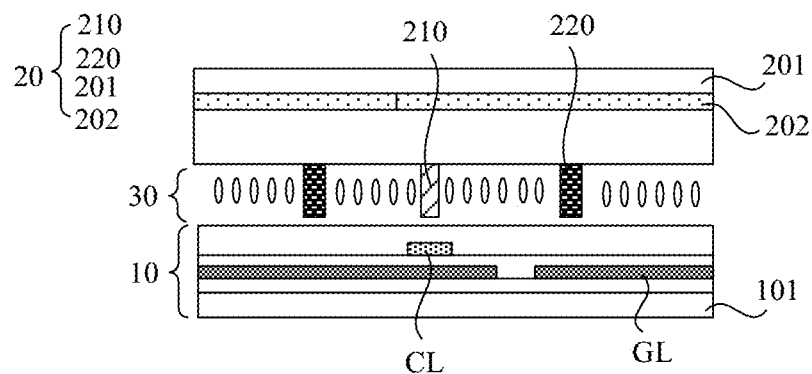
FIG. 4 is a sectional view of the display panel in FIG. 3 taken along the line B-B'.

In some embodiments, as shown in FIGS. 3 and 4, the opposite substrate 20 further includes a plurality of filter patterns 202 disposed on a side of the first spacers 210 proximate to the second substrate 201.

For example, the plurality of filter patterns 202 include red filter patterns, blue filter patterns and green filter patterns. Light emitted from the red filter patterns is red light, light emitted from the blue filter patterns is blue light, and light emitted from the green filter patterns is green light.

Orthographic projections of a column of sub-pixels on the first substrate 101 are within an orthographic projection of a filter pattern 202 on the first substrate 101.

An orthographic projection of the first spacer 210 on the second substrate 201 is located within an orthographic projection of a filter pattern 202 on the second substrate 201.

In a direction perpendicular to an extension direction of the filter pattern 202 (i.e., the horizontal direction X in FIG. 3), the filter pattern 202 has a protruding portion T1 at a position corresponding to the first spacer 210. The orthographic projection of the first spacer 210 on the second substrate 201 overlaps with an orthographic projection of the protruding portion T1 of the filter pattern 202 on the second substrate 201.

In a case where the opposite substrate 20 includes the second spacers 220, the orthographic projection of the protruding portion T1 on the second substrate 201 is non-overlapping with orthographic projections of the second spacers 220 on the second substrate 201.

In this case, a bottom of the first spacer 210 is located on the same filter pattern 202 without stretching across two adjacent filter patterns 202. A film thickness uniformity of the same filter pattern 202 is better than a film thickness uniformity of different filter patterns 202, that is, a thickness uniformity of the protruding portion T1 of the filter pattern 202 where the first spacer 210 is located is relatively good. Therefore, a surface of the first spacer 210 proximate to the second substrate 201 is flat, and the first spacer is uniformly stressed in the process of pressing the display panel 100, thereby preventing the first spacer 210 from being damaged (e.g., from cracking).

It will be noted that, in the direction parallel to the plane where the second substrate 201 is located, a distance between edges proximate to each other of the first spacer 210 and the protruding portion T1 of the filter pattern 202 corresponding to the first spacer 210 and a distance between edges proximate to each other of the protruding portion T1 and the second spacer 220 adjacent to the protruding portion T1, are both greater than a deviation of process capability in the actual production process. In this way, it is possible to avoid a problem caused by process errors that the orthographic projection of the first spacer 210 on the second substrate 201 is beyond the edge of the orthographic projection of the protruding portion T1 of the filter pattern 202 on the second substrate 201 to affect flatness of the surface of the first spacer 210 proximate to the second substrate 201, thereby avoiding affecting the supporting capacity of the first spacers 210 and the anti-pressure ability of the display panel 100.

In some embodiments, as shown in FIG. 3, a filter pattern 202 adjacent to the filter pattern 202 having the protruding portion T1 in the plurality of filter patterns 202 has a recessed portion T2. The protruding portion T1 extends into the recessed portion T2.

It will be noted that the protruding portion T1 may be in contact with an edge of the recessed portion T2 proximate to the protruding portion T1 without a gap therebetween. In the actual production process, the protruding portion T1 may be lapped on the edge of the recessed portion T2 proximate to the protruding portion T1, or there is a small gap or approximately no gap between the protruding portion T1 and the edge of the recessed portion T2 proximate to the protruding portion T1.

In a case where the protruding portion T1 is lapped on the edge of the recessed portion T2 proximate to the protruding portion T1, an orthographic projection of the first spacer 210 on the first substrate 101 is non-overlapping with a lapped region. In a case where there is a gap between the protruding portion T1 and the edge of the recessed portion T2 proximate to the protruding portion T1, the orthographic projection of the first spacer 210 on the first substrate 101 is non-overlapping with an orthographic projection of the gap on the first substrate 101. It will be understood that an edge of an orthographic projection of the protruding portion T1 on the array substrate 10 proximate to the recessed portion T2 coincides with an edge of an orthographic projection of the recessed portion T2 on the array substrate 10 proximate to the protruding portion T1.

In this case, an orthographic projection of a protruding portion T1 of a filter pattern 202 on the second substrate 201 is non-overlapping with orthographic projections of other filter patterns 202 on the second substrate 201. An orthographic projection of a recessed portion T2 of a filter pattern 202 on the second substrate 201 is non-overlapping with orthographic projections of other filter patterns 202 on the second substrate 201.

Thus, at a position of the protruding portion T1 of the filter pattern 202, an adjacent filter pattern 202 has the recessed portion T2, which does not cover the protruding portion T1 and does not affect film uniformity of the protruding portion T1, so that thicknesses of all positions of the protruding portion T1 are uniform. In this case, the surface of the first spacer 210 proximate to the second substrate 201 is flat, and the first spacer is uniformly stressed in the process of pressing the display panel 100, thereby preventing the first spacer 210 from being damaged.

In some embodiments, as shown in FIGS. 1 and 2, the array substrate 10 further includes a plurality of gate lines GL disposed on the first substrate 101. At least one gate line GL is located between two adjacent rows of sub-pixels.

The orthographic projection of the first spacer 210 on the first substrate 101 overlaps with an orthographic projection of the gate line GL on the first substrate 101.

In a case where the opposite substrate 20 includes the plurality of second spacers 220, the orthographic projection of the second spacer 220 on the first substrate 101 overlaps with the orthographic projection of the gate line GL on the first substrate 101.

For example, a material of the gate line GL is a metal material.

In this case, in the process of pressing the display panel 100, the first spacer 210 and the second spacer 220 are supported by the gate line GL on a side proximate to the array substrate 10, thereby improving supporting effects of the first spacer 210 and the second spacer 220.

It will be noted that a position of the second spacer 220 may be designed by those skilled in the art according to a size of a space between the gate line GL and adjacent sub-pixels on a condition that normal display of the display panel 100 is ensured. For example, as shown in FIG. 1, in an extension direction of the gate line GL, two adjacent second spacers 220 are arranged in a staggered manner.

In some embodiments, as shown in FIG. 1, the gate line GL has protruding portions T3 in a column direction in which the sub-pixels are arranged (i.e., the vertical direction Y in FIG. 1).

In the case where the opposite substrate 20 includes the plurality of second spacers 220, the orthographic projection of the second spacer 220 on the array substrate 10 is located in a region where the protruding portion of the gate line GL is located.

In this case, in the process of pressing the display panel 100, the second spacer 220 may be supported by the protruding portion of the gate line GL, so that a contact surface between the second spacer 220 and the array substrate 10 is uniformly stressed, thereby preventing the second spacer 220 from being damaged.

It will be noted that a protruding direction of the protruding portion of the gate line GL may be designed by those skilled in the art according to a space size of a region where the gate line GL is located.

In some embodiments, as shown in FIG. 1, in the column direction in which the sub-pixels are arranged, the protruding portion of the gate line GL protrudes towards a side away from a row of sub-pixels coupled to the gate line GL. In this way, it is possible to avoid that a distance between the gate line GL and the sub-pixel P is so small that a size of a light-emitting region of the sub-pixel is affected, thereby avoiding affecting an aperture ratio of the display panel 100.

In some embodiments, as shown in FIGS. 1, 3, and 6 to 9, two gate lines GL are disposed between two adjacent rows of sub-pixels.

In two adjacent sub-pixels in a row of sub-pixels, a gate line GL to which one sub-pixel is coupled is located on one side of two opposite sides of the row of sub-pixels in the column direction, and a gate line GL to which the other sub-pixel is coupled is located on the other side of the two opposite sides of the row of sub-pixels in the column direction.

It will be understood that a row of sub-pixels are coupled to two gate lines GL. For example, in a row of sub-pixels, sub-pixels in odd columns are coupled to one gate line GL, and sub-pixels in even columns are coupled to the other gate line GL.

In some embodiments, as shown in FIG. 1, in the case where the opposite substrate 20 includes the plurality of second spacers 220, in the region between two adjacent rows of sub-pixels, an orthographic projection of one second spacer 220 in two adjacent second spacers 220 on the first substrate 101 overlaps with an orthographic projection of one gate line GL in the two gate lines GL on the first substrate 101, and an orthographic projection of the other second spacer 220 in the two adjacent second spacers 220 on the first substrate 101 overlaps with an orthographic projection of the other gate line GL in the two gate lines GL on the first substrate 101.

It will be understood that the two gate lines GL in the region between two adjacent rows of sub-pixels are respectively coupled to the two adjacent rows of sub-pixels.

It will be noted that the positions of the second spacers 220 may be designed by those skilled in the art according to actual situations and a size of a space where the gate line GL is located.

For example, in the region between two adjacent rows of sub-pixels, the orthographic projections of the two adjacent second spacers 220 on the first substrate 101 may overlap with the orthographic projection of one gate line GL in the two gate lines GL on the first substrate 101, but may be non-overlapping with the orthographic projection of the other gate line GL in the two gate lines GL on the first substrate 101.

In some embodiments, as shown in FIGS. 1, 3, and 6 to 9, the array substrate 10 further includes a plurality of data lines DL disposed on the first substrate 101. Two adjacent columns of sub-pixels are coupled to a data line DL.

For example, two adjacent columns of sub-pixels are grouped into a group, and a data line DL is disposed between two adjacent groups of sub-pixels.

In some embodiments, as shown in FIGS. 1, 3, and 6 to 9, the array substrate 10 further includes a plurality of common signal lines CL disposed on the first substrate 101. The plurality of common signal lines CL and the plurality of data lines DL have the same extension direction. A common signal line CL is located between two adjacent columns of sub-pixels. The common signal line CL is configured to transmit a common voltage signal to sub-pixels.

In a row direction in which the sub-pixels P are arranged, a common signal line CL is located between two adjacent data lines DL.

As shown in FIGS. 1 and 2, the orthographic projection of the first spacer 210 on the first substrate 101 overlaps with an orthographic projection of the common signal line CL on the first substrate 101.

For example, two adjacent columns of sub-pixels are grouped into a group, a data line DL is disposed between two adjacent groups of sub-pixels, and a common signal line CL is disposed between two columns of sub-pixels in each group of sub-pixels.

The orthographic projection of the first spacer 210 on the first substrate 101 overlaps with an orthographic projection of an intersection region of the common signal line CL and the gate line GL on the first substrate 101.

In some embodiments, as shown in FIGS. 1, 3, and 6 to 9, the array substrate 10 further includes a thin film transistors (TFT) disposed in the sub-pixel P.

TFTs in the two adjacent sub-pixels in the row of sub-pixels are respectively located on two opposite sides of the row of sub-pixels in the column direction.

For the two opposite sides of the row of sub-pixels P in the column direction, a TFT on one side is coupled to a gate line GL disposed on the same side as the TFT on the one side, and a TFT on the other side is coupled to a gate line GL disposed on the same side as the TFT on the other side.

Figure 6:
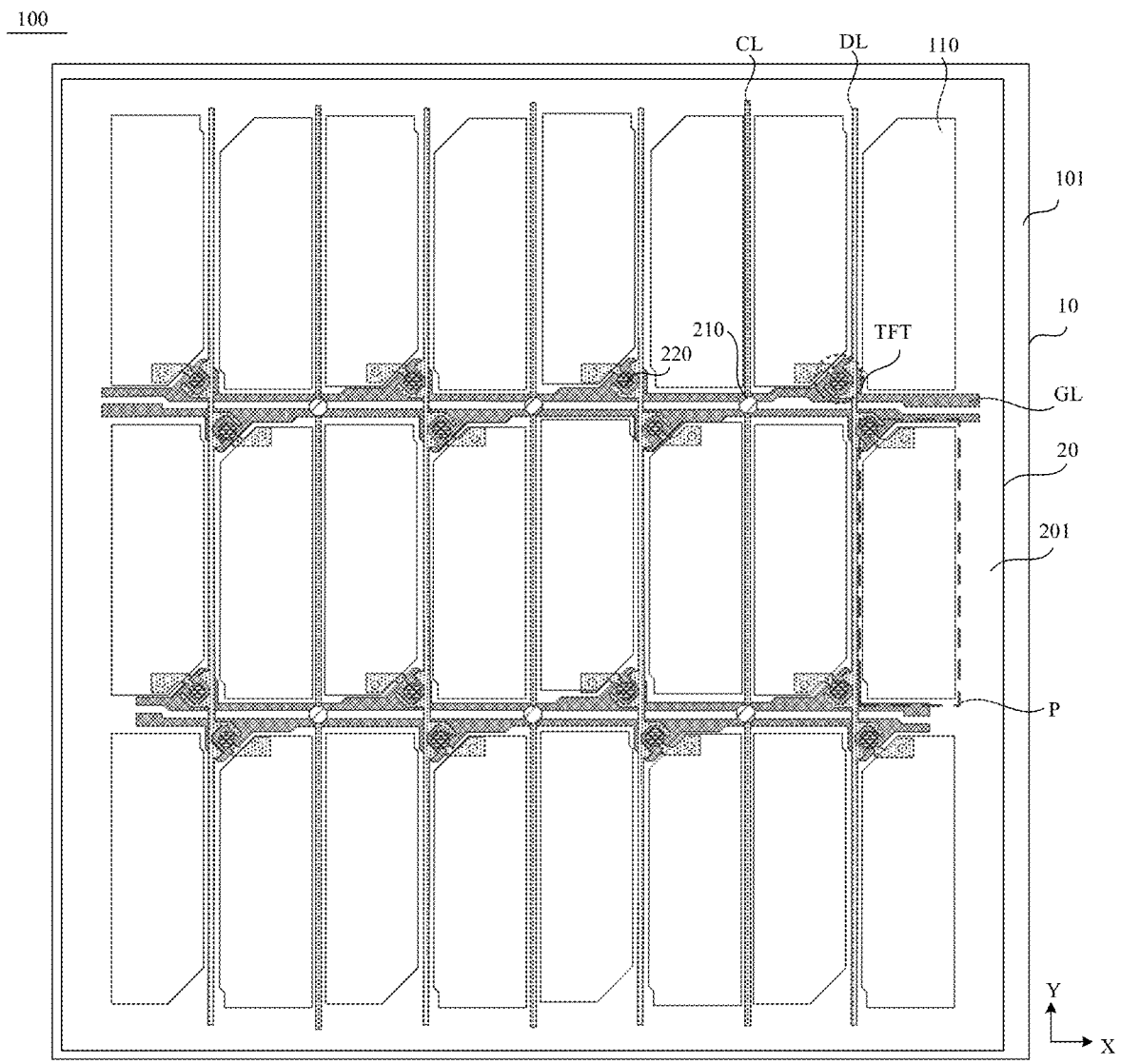
FIG. 6 is a structural diagram of yet another display panel, in accordance with some embodiments.

For example, in the case where the opposite substrate 20 includes the plurality of second spacers 220, as shown in FIGS. 1, 3 and 9, the orthographic projection of the second spacer 220 on the first substrate 101 is non-overlapping with an orthographic projection of the TFT on the first substrate 101; or as shown in FIG. 6, the orthographic projection of the second spacer 220 on the first substrate 101 overlaps with an orthographic projection of a TFT on the first substrate 101.

It will be noted that the positions of the second spacers 220 may be designed by those skilled in the art according to actual situations. For example, in a case where the opposite substrate 20 further includes main spacers, the positions of the second spacers 220 may be designed according to a height difference between a main spacer and the second spacer 220 (i.e., the auxiliary spacer) and a position of the main spacer, which is not limited here.

In some embodiments, as shown in FIGS. 1, 3 and 6 to 9, the array substrate 10 further includes a plurality of first electrodes 110 disposed on the first substrate 101. A first electrode 110 is located in a sub-pixel P. The first electrode 110 is coupled to the TFT.

The first electrode 110 is a pixel electrode.

Figure 5:
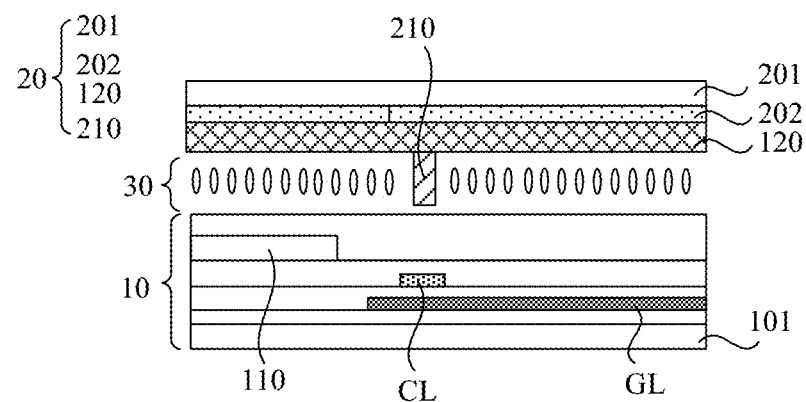
FIG. 5 is a sectional view of the display panel in FIG. 3 taken along the line C-C'.

As shown in FIG. 5, the opposite substrate 20 further includes a second electrode 120 disposed on the second substrate 201. The second electrode 120 is located on the side of the first spacer 210 proximate to the second substrate 201.

The second electrode 120 is a common electrode.

It will be understood that in a case where the opposite substrate 20 includes the plurality of filter patterns 202, the second electrode 120 is located on a side of the filter pattern 202 away from the second substrate 201.

In a case where the array substrate 10 includes the plurality of common signal lines CL, the second electrode 120 is coupled to the common signal lines CL (not shown in the figures).

Figure 7:
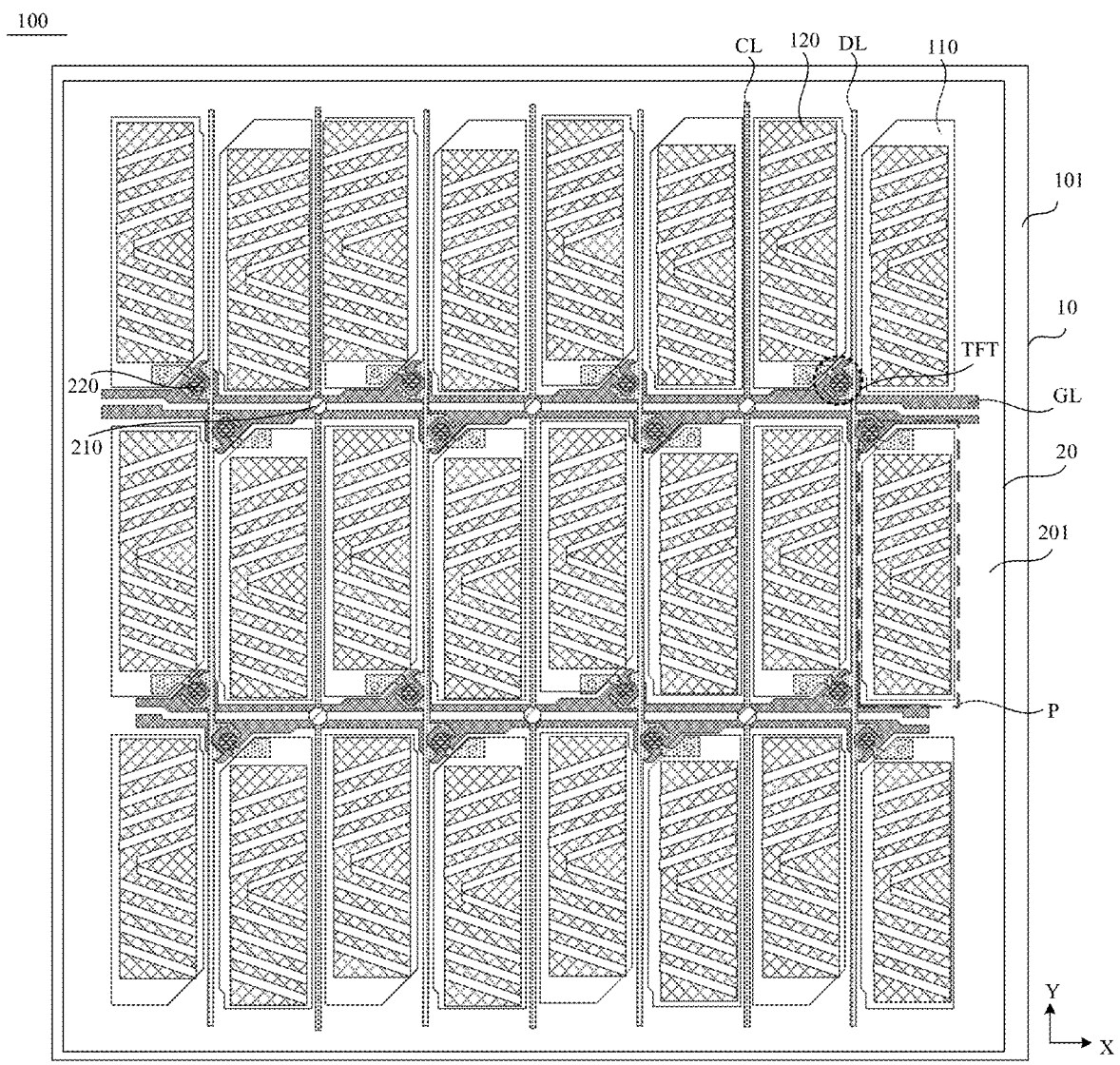
FIG. 7 is a structural diagram of yet another display panel, in accordance with some embodiments.

In some embodiments, as shown in FIG. 7, the array substrate 10 further includes the first electrodes 110 and the second electrodes 120 disposed on the first substrate 101 and located in the sub-pixels P.

The first electrode 110 is a planar electrode, and the second electrode 120 is a slit electrode.

The first electrode 110 is closer to the first substrate 101 than the second electrode 120.

One of the first electrode 110 and the second electrode 120 is coupled to the TFT. For example, the first electrode 110 is coupled to the TFT, and in this case, the first electrode 110 is a pixel electrode; alternatively, the second electrode 120 is coupled to the TFT, and in this case, the second electrode 120 is a common electrode.

It will be understood that in the case where the array substrate 10 includes the plurality of common signal lines CL, if the first electrode 110 is coupled to the TFT, the second electrode 120 is coupled to the common signal line CL; alternatively, if the second electrode 120 is coupled to the TFT, the first electrode 110 is coupled to the common signal line CL.

Figure 8:
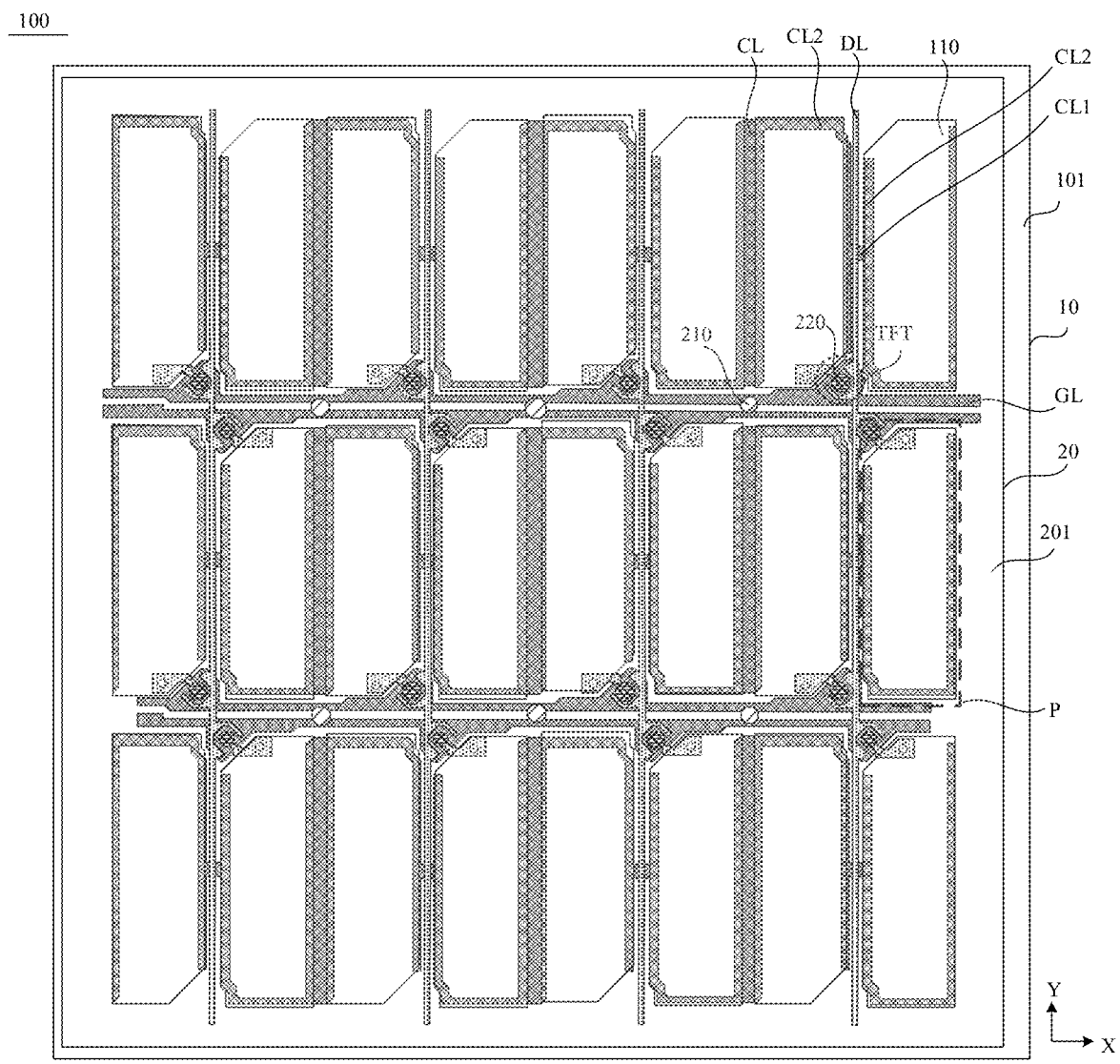
FIG. 8 is a structural diagram of yet another display panel, in accordance with some embodiments.

In some embodiments, as shown in FIG. 8, the array substrate 10 further includes a plurality of common signal lines CL disposed on the first substrate 101.

The plurality of common signal lines CL and the plurality of gate lines GL are disposed in the same layer and are made of the same material.

A common signal line CL is located in a region where a row of sub-pixels is located. An orthographic projection of the common signal line CL on the first substrate 101 is non-overlapping with the orthographic projection of the TFT on the first substrate 101.

As shown in FIG. 8, the common signal line CL has a plurality of bending segments CL2, and any two adjacent bending segments CL2 are coupled by a conductive pattern CL1 at edges thereof proximate to each other. The conductive pattern CL1 and the common signal line CL are in the same layer, and an orthographic projection of the conductive pattern on the first substrate 101 overlaps with orthographic projection of the data line DL on the first substrate 101. A bending segment is located in a region where two adjacent sub-pixels in a row of sub-pixels are located, and a bending segment includes five sub-segments coupled in sequence. In an orthographic projection of the middlemost sub-segment on the first substrate 101, edges of the orthographic projection on opposite sides in the extension direction of the gate line GL are located in different sub-pixels of two adjacent sub-pixels, and a middle portion of the orthographic projection is located in a gap region between the two sub-pixels.

In addition, in some embodiments, the opposite substrate 20 further includes third spacers disposed on the second substrate 201.

The third spacers serve as main spacers to support the display panel 100 in the process of pressing the display panel 100. A supporting area of the third spacers to the display panel 100 is smaller than a supporting area of the first spacers 210 and the second spacers 220 as a whole to the display panel 100.

Orthographic projections of the third spacers on the array substrate 10 are non-overlapping with the orthographic projections of the first spacers 210 on the array substrate 10 and the orthographic projections of the second spacers 220 on the array substrate 10.

In a thickness direction of the second substrate 201, a height of the third spacer is greater than or approximately equal to a height of the second spacer 220.

For example, the orthographic projection of the first spacer 210 on the array substrate 10 is located between the orthographic projection of the second spacer 220 on the array substrate 10 and the orthographic projection of the third spacer on the array substrate 10.

An orthographic projection of the third spacer on the first substrate 101 overlaps with the orthographic projection of the TFT on the first substrate 101; alternatively, the orthographic projection of the third spacer on the first substrate 101 is located between two sub-pixels in two adjacent rows and overlaps with the orthographic projection of the gate line GL on the first substrate 101. Moreover, orthographic projections of the third spacers on the array substrate 10 are uniformly distributed.

It will be noted that a distribution density and an arrangement position of the third spacers may be designed by those skilled in the art according to actual requirements. For example, the array substrate 10 includes a plurality of sub-pixel groups, each sub-pixel group includes sub-pixels P, and the number of the sub-pixels P that each sub-pixel group includes is the same. An orthographic projection of a third spacer on the first substrate 101 is located in an orthographic projection of a sub-pixel group on the first substrate 101.

For example, in the case where the opposite substrate 20 includes the plurality of second spacers 220, the orthographic projection of the second spacer 220 on the first substrate 101 is non-overlapping with the orthographic projection of the TFT on the first substrate 101; and in a case where the opposite substrate 20 further includes the third spacers (i.e., the main spacers) and a height difference between the third spacer and the second spacer 220 (i.e., the auxiliary spacer) is relatively small (for example, the height difference is approximately 0.1 μm), the orthographic projection of the third spacer on the first substrate 101 overlaps with the orthographic projection of the TFT on the first substrate 101. In this way, it is possible to avoid a problem that in a case where the height difference between the third spacer (i.e., the main spacer) and the second spacer 220 (i.e., the auxiliary spacer) is relatively small and the orthographic projection of the third spacer on the first substrate 101 overlaps with the orthographic projection of the TFT on the first substrate 101, if the orthographic projection of the second spacer 220 on the first substrate 101 overlaps with the orthographic projection of the TFT on the first substrate 101, a support of the second spacer 220 is excessive in the process of pressing the display panel 100, resulting in a poor display (e.g., an uneven display brightness) of the display panel 100.

For example, in the case where the opposite substrate 20 includes the plurality of second spacers 220, the orthographic projection of the second spacer 220 on the first substrate 101 overlaps with the orthographic projection of the TFT on the first substrate 101; and in a case where the opposite substrate 20 includes the third spacers (i.e., the main spacers) and the height difference between the third spacer and the second spacer 220 (i.e., the auxiliary spacer) is relatively great (for example, the height difference is greater than 0.5 μm), the orthographic projection of the third spacer on the first substrate 101 overlaps with the orthographic projection of the TFT on the first substrate 101. In this way, it is possible to avoid a problem that in the case where the opposite substrate 20 includes the third spacers (i.e., the main spacers) and the height difference between the third spacer and the second spacer 220 (i.e., the auxiliary spacer) is relatively great (for example, the height difference is greater than 0.5 μm), if the orthographic projection of the third spacer on the first substrate 101 overlaps with the orthographic projection of the gate line GL on the first substrate 101, a supporting capacity of the third spacer is insufficient in the process of pressing the display panel 100, resulting that the anti-pressure ability of the display panel 100 is reduced.

In addition, as shown in FIG. 9, the display apparatus 200 further includes a driver integrated circuit (IC). The driver IC is bonded to the array substrate 10 in the display panel 100, and is coupled to the data lines DL.

The driver IC is configured to transmit data signals to the data lines DL.

For example, the display apparatus 200 may be any apparatus that displays an image whether in motion (e.g., a video) or stationary (e.g., a still image), and whether textual or graphical. More specifically, it is anticipated that the embodiments may be implemented in a variety of electronic apparatuses or associated with a variety of electronic apparatuses. The variety of electronic apparatuses include, but are not limited to mobile phones, wireless apparatuses, personal data assistants (PDAs), hand-held or portable computers, GPS receivers/navigators, cameras, MP4 video players, video cameras, game consoles, watches, clocks, calculators, television monitors, flat panel displays, computer monitors, automobile displays (e.g., odometer displays, etc.), navigators, cockpit controllers and/or displays, displays of camera views (e.g., displays of rear-view cameras in vehicles), electronic photos, electronic billboards or signs, projectors, building structures, packaging and aesthetic structures (e.g., displays for displaying an image of a piece of jewelry), etc.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display apparatus, comprising:
   an array substrate including a first substrate and a plurality of sub-pixels disposed on the first substrate and arranged in an array; and
   an opposite substrate arranged opposite to the array substrate, and including a second substrate and a plurality of first spacers disposed on a side of the second substrate proximate to the array substrate; wherein
   an orthographic projection of a first spacer on the array substrate is located in a region where a region between two adjacent rows of sub-pixels intersects with a region between two adjacent columns of sub-pixels;
   the array substrate further includes a plurality of gate lines disposed on the first substrate; at least one gate line is located between the two adjacent rows of sub-pixels; and an orthographic projection of the first spacer on the first substrate overlaps with an orthographic projection of a gate line of the at least one gate line on the first substrate;
   the opposite substrate further includes a plurality of second spacers, an orthographic projection of a second spacer on the first substrate overlaps with the orthographic projection of the gate line of the at least one gate line on the first substrate;
   two gate lines are disposed between the two adjacent rows of sub-pixels; and in a column direction in which the sub-pixels are arranged, in two adjacent sub-pixels in a row of sub-pixels, a gate line to which a sub-pixel is coupled is located on a side of two opposite sides of the row of sub-pixels in the column direction, and a gate line to which another sub-pixel is coupled is located on another side of the two opposite sides of the row of sub-pixels in the column direction; and
   in the region between the two adjacent rows of sub-pixels, an orthographic projection of a second spacer in two adjacent second spacers on the first substrate overlaps with an orthographic projection of a gate line in the two gate lines on the first substrate, and an orthographic projection of another second spacer in the two adjacent second spacers on the first substrate overlaps with an orthographic projection of another gate line in the two gate lines on the first substrate.

2. The display apparatus according to claim 1, wherein an orthographic projection of a second spacer on the second substrate is non-overlapping with an orthographic projection of the first spacer on the second substrate; and
the plurality of second spacers are arranged in a plurality of columns, second spacers in each column are arranged in a column direction in which the plurality of sub-pixels are arranged, orthographic projections of the second spacers in each column on the array substrate are located in a column region where a column of sub-pixels are located.

3. The display apparatus according to claim 2, wherein the plurality of second spacers and the plurality of first spacers are disposed in a same layer.

4. The display apparatus according to claim 2, wherein a dimension of the first spacer and a dimension of the second spacer are approximately equal in a direction perpendicular to a plane where the second substrate is located.

5. The display apparatus according to claim 2, wherein in a unit area of 1 mm$^2$ of the array substrate, a sum of an area of a surface of the first spacer away from the second substrate and an area of a surface of the second spacer away from the second substrate is greater than 10000 μm$^2$.

6. The display apparatus according to claim 1, wherein in a column direction in which the sub-pixels are arranged, the gate line has a protruding portion; and
an orthographic projection of a second spacer on the array substrate is located in a region where the protruding portion of the gate line is located.

7. The display apparatus according to claim 6, wherein in the column direction in which the sub-pixels are arranged, the protruding portion of the gate line protrudes towards a side away from a row of sub-pixels coupled to the gate line.

8. The display apparatus according to claim 1, wherein the array substrate further includes a plurality of data lines disposed on the first substrate, wherein
two adjacent columns of sub-pixels are coupled to a data line.

9. The display apparatus according to claim 8, wherein the array substrate further includes a plurality of common signal lines disposed on the first substrate, wherein
the plurality of common signal lines and the plurality of data lines are disposed in a same layer and have a same extension direction;
a common signal line is located between two adjacent columns of sub-pixels;
in a row direction in which the sub-pixels are arranged, a common signal line is located between two adjacent data lines; and
the orthographic projection of the first spacer on the first substrate overlaps with an orthographic projection of the common signal line on the first substrate.

10. The display apparatus according to claim 1, wherein the array substrate further includes a thin film transistor disposed in a sub-pixel, wherein
thin film transistors in the two adjacent sub-pixels in the row of sub-pixels are respectively located on two opposite sides of the row of sub-pixels in the column direction in which the sub-pixels are arranged; and
for the two opposite sides of the row of sub-pixels in the column direction, a thin film transistor of the thin film transistors in the two adjacent sub-pixels on a side is coupled to a gate line disposed on a same side as the thin film transistor on the side, and another thin film transistor of the thin film transistors in the two adjacent sub-pixels on another side is coupled to a gate line disposed on a same side as the thin film transistor on the another side.

11. The display apparatus according to claim 10, wherein the opposite substrate includes a plurality of second spacers, an orthographic projection of a second spacer on the first substrate is non-overlapping with an orthographic projection of the thin film transistor on the first substrate.

12. The display apparatus according to claim 10, wherein the opposite substrate further includes a plurality of second spacers, an orthographic projection of a second spacer on the first substrate overlaps with an orthographic projection of the thin film transistor on the first substrate.

13. The display apparatus according to claim 10, wherein the array substrate further includes a plurality of first electrodes disposed on the first substrate, a first electrode is located in the sub-pixel, and the first electrode is coupled to the thin film transistor; and
the opposite substrate further includes a second electrode disposed on the second substrate, the second electrode is located on a side of the first spacers proximate to the second substrate.

14. The display apparatus according to claim 10, wherein the array substrate further includes a first electrode and a second electrode disposed on the first substrate and located in the sub-pixel;
the first electrode is a planar electrode, and the second electrode is a slit electrode, the first electrode is closer to the first substrate than the second electrode; and
one of the first electrode and the second electrode is coupled to the thin film transistor.

* * * * *